(12) United States Patent
Bagdi

(10) Patent No.: US 6,612,525 B2
(45) Date of Patent: Sep. 2, 2003

(54) ELECTRO-OPTICAL COMPONENT HOLDER

(75) Inventor: William S. Bagdi, Toms River, NJ (US)

(73) Assignee: JDS Uniphase Corporation, San Jose, CA (US)

( * ) Notice: Subject to any disclaimer, the term of this patent is extended or adjusted under 35 U.S.C. 154(b) by 5 days.

(21) Appl. No.: 10/167,278

(22) Filed: Jun. 12, 2002

(65) Prior Publication Data

US 2002/0190166 A1 Dec. 19, 2002

Related U.S. Application Data

(60) Provisional application No. 60/298,405, filed on Jun. 18, 2001.

(51) Int. Cl.[7] .................................. F16B 45/00
(52) U.S. Cl. ....................... 248/71; 248/74.1
(58) Field of Search ............... 248/71, 74.1, 74.2, 248/65, 73, 67.7, 316.5; 24/16 PB

(56) References Cited

U.S. PATENT DOCUMENTS

| 3,944,177 A | * | 3/1976 | Yoda ..................... 248/74.2 |
|---|---|---|---|
| 4,131,258 A | | 12/1978 | Okuda et al. ............... 248/73 |
| 4,681,288 A | * | 7/1987 | Nakamura ................. 248/71 |
| 5,642,557 A | * | 7/1997 | Clews ..................... 24/339 |
| 6,209,827 B1 | | 4/2001 | Kawai ..................... 248/73 |

* cited by examiner

Primary Examiner—Ramon O. Ramirez
(74) Attorney, Agent, or Firm—Allen, Dyer, Doppelt, Milbrath & Gilchrist, P.A.

(57) ABSTRACT

Conventional methods for mounting electro-optical components, such as photodiodes, to the surface of a printed circuit board include the use of labor intensive brackets and fastening devices, such as screws or adhesive. The present invention provides a relatively small and simple component holder, which is easily attached to a circuit board by inserting the lower portion of the holder through a "key-hole" slot in the circuit board and rotating the upper portion, thereby squeezing the circuit board between the upper and lower portions. The component holder according to the present invention enables the electro-optical component to be mounted flush with the upper surface of the circuit board. Moreover, flexible locking elements enable the component holder to be mounted onto circuit boards of various thicknesses.

18 Claims, 4 Drawing Sheets

ELECTRO-OPTICAL COMPONENT HOLDER

CROSS-REFERENCE TO RELATED APPLICATIONS

The present invention claims priority from U.S. patent application Ser. No. 60/298,405 filed Jun. 18, 2001.

TECHNICAL FIELD

The present application relates to an electro-optical component holder, and in particular to a device for holding an electro-optical component, such as a photodiode, flush with the surface of a printed circuit board.

BACKGROUND OF THE INVENTION

A recent push towards automation in the fiber optics industry has necessitated the reevaluation of all manufacturing processes to ensure each manual process step can be replaced by an automated one. Conventionally, photodiodes and other electro-optical components are secured to a printed circuit board using a mounting bracket, which is screwed, bolted or glued to the upper surface thereof. The conventional process is quite labor intensive and very difficult to automate. Furthermore, the conventional mounting brackets take up a great deal of space on the circuit board, where space is usually at a premium.

One solution to this problem involves the use of a "key hole" clamp, which is typically mounted on a planar surface by inserting a lower portion of the device through an eccentric "key-hole" slot extending through the planar surface, and rotating the device 90°. This type of clamp is disclosed in U.S. Pat. Nos. 4,131,258 issued Dec. 26, 1978 to Seiji Okuda et al; and 6,209,827 issued Apr. 3, 2001 to Tsutomu Kawai. Unfortunately, the Okuda et al device has a complicated lower locking structure, and an upper clamping structure adapted only for loosely guiding "linear material". The Kawai device is only locked in position if rotated in the proper direction. Furthermore, the Kawai device is only adapted to loosely guide wire cables therethrough. Moreover, both devices require a large base portion for stability, and neither device is capable of securely mounting a single structure flush with the surface to which it is attached. Accordingly, the conventional devices disclosed in these references do not solve the aforementioned problems.

It is an object of the present invention to overcome the shortcomings of the prior art by providing an electro-optical component holder for securely holding an electro-optical component flush with the circuit board to which it is attached.

Another object of the present invention is to provide an easily installable electro-optical component holder that takes up very little space on the printed circuit board on which it is mounted.

SUMMARY OF THE INVENTION

Accordingly, the present invention relates to a component holder device for securing an electro-optical component substantially flush with an upper surface of a printed circuit board. The printed circuit board includes a slot for receiving the component holder. The component holder comprises:

first and second base sections, each base section having a lower surface for engaging the upper surface of the printed circuit board;

first and second resilient arms extending from the first and second base sections, respectively, for clamping the electro-optical component therebetween, the first and second resilient arms forming a cavity which extends substantially level with the lower surface of the first and second base sections, whereby the electro-optical component will be mounted substantially flush with the upper surface of the printed circuit board;

a body extending from the first and second base sections for extending through the slot;

first and second resilient feet extending outwardly from the body for engaging a lower surface of the printed circuit board after the body has been inserted through the slot and the component holder has been rotated.

BRIEF DESCRIPTION OF THE DRAWINGS

The invention will be described in greater detail with reference to the accompanying drawings which represent a preferred embodiment thereof, and wherein.

DETAILED DESCRIPTION

Figure 1:
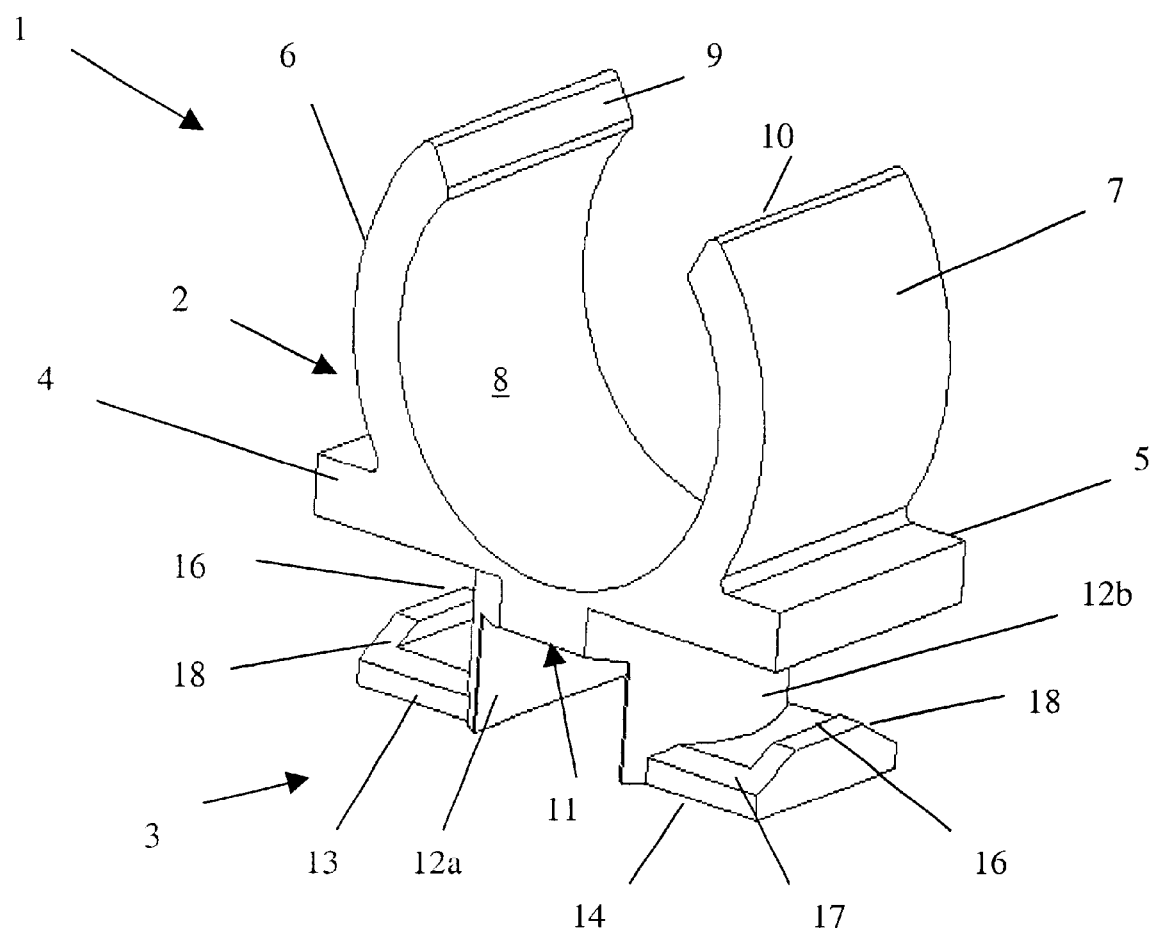
FIG. 1 is an isometric view of the electro-optical component holder according to the present invention.

With reference to FIG. 1, the electro-optical component holder according to the present invention, generally indicated at 1, includes an upper clamping section 2 and a lower locking section 3. The upper clamping section 2 includes two separate rectangular bases 4 and 5 for engaging the upper surface of a printed circuit board, and first and second opposed spring clamping arms 6 and 7 forming a slot 8 for holding the electro-optical component therein. Having separate bases enables the bottom of the slot 8 to be level with the undersurfaces of the bases 4 and 5, and therefore substantially flush with the upper surface of the printed circuit board on which the holder 1 is mounted. The slot 8 is open at the top to facilitate insertion and removal of the electro-optical device by pushing the device straight down or pulling the device straight up. The outer free ends 9 and 10 of the arms 6 and 7, respectively, are at an angle to the direction of insertion of the electro-optical component, thereby acting as camming surfaces and helping to separate the arms 6 and 7 while the component is being inserted. When the component has been fully inserted, the arms 6 and 7 snap into position around the component. Preferably, the arms 6 and 7 are designed to provide a substantially even force around most of the component when it has been inserted all the way into the slot 8. The C-shaped arms 6 and 7 illustrate the preferred design for receiving a cylindrical component, but other arm shapes to suite other component shapes are within the scope of this invention.

The lower locking section 3 includes of an insertion body 11, which preferably is provided with first and second legs 12a and 12b. The first and second legs 12a and 12b are included to increase the flexibility of the lower locking section 3, which facilitates attachment of the device and reduces the chance of a breakage during installation. First and second feet 13 and 14 extend outwardly from the outer free ends of the legs 12a and 12b, respectively. Feet 13 and 14, each have a toe 16 extending upwardly from the outer free end thereof for engaging the undersurface of a circuit board. Each toe 16 has beveled front and rear surfaces 17 and 18, respectively, for facilitating the rotation of the component holder 1 into and out of the desired position. The legs 12a and 12b have rounded outer surfaces also to facilitate the rotation of the component holder 1 during installation. To decrease the overall footprint of the component holder 1, the bases 4 and 5 extend parallel to and are superposed above the feet 13 and 14. Preferably, the component holder 1 is of unitary construction, i.e. injection molded from plastic, which provides both the strength and the resiliency required to mount and hold the electro-optical component securely on a circuit board.

Figure 2:
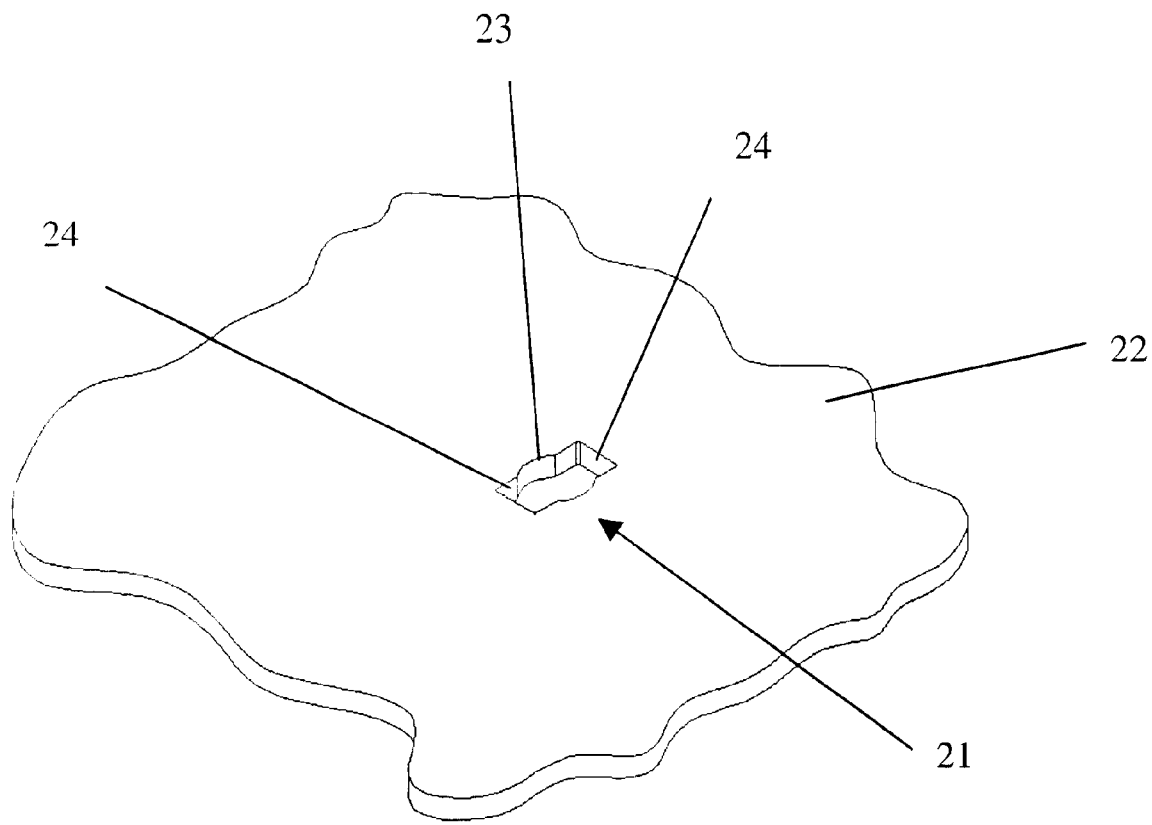
FIG. 2 is a isometric view of a portion of a printed circuit board including a "key hole" slot for receiving the component holder of FIG. 1.

FIG. 2 displays a "key-hole" slot 21, which is cut out of a printed circuit board 22. The slot 21 includes a circular middle portion 23 and two rectangular end portions 24. During insertion, the first and second feet 13 and 14 are aligned with the rectangular portions 24. To lock the component holder 1 in place, the component holder 1 is rotated causing the toes 16 to engage the under side of the printed circuit board 22, which is squeezed between the bases 4 and 5 and the toes 16. Preferably, the component holder 1 is rotated 90° in either direction after insertion to provide the most stable position. The component holder 1 can be used with different printed circuit boards having various thicknesses, due to the resiliency of the legs 12a and 12b and the feet 13 and 14, which bend to provide the required distance. The beveled surfaces 17 and 18 act as camming surfaces when engaging the undersurface of the printed circuit board during installation to force the legs 12a and 12b, and feet 13 and 14 to flex to the required position.

Figure 3:
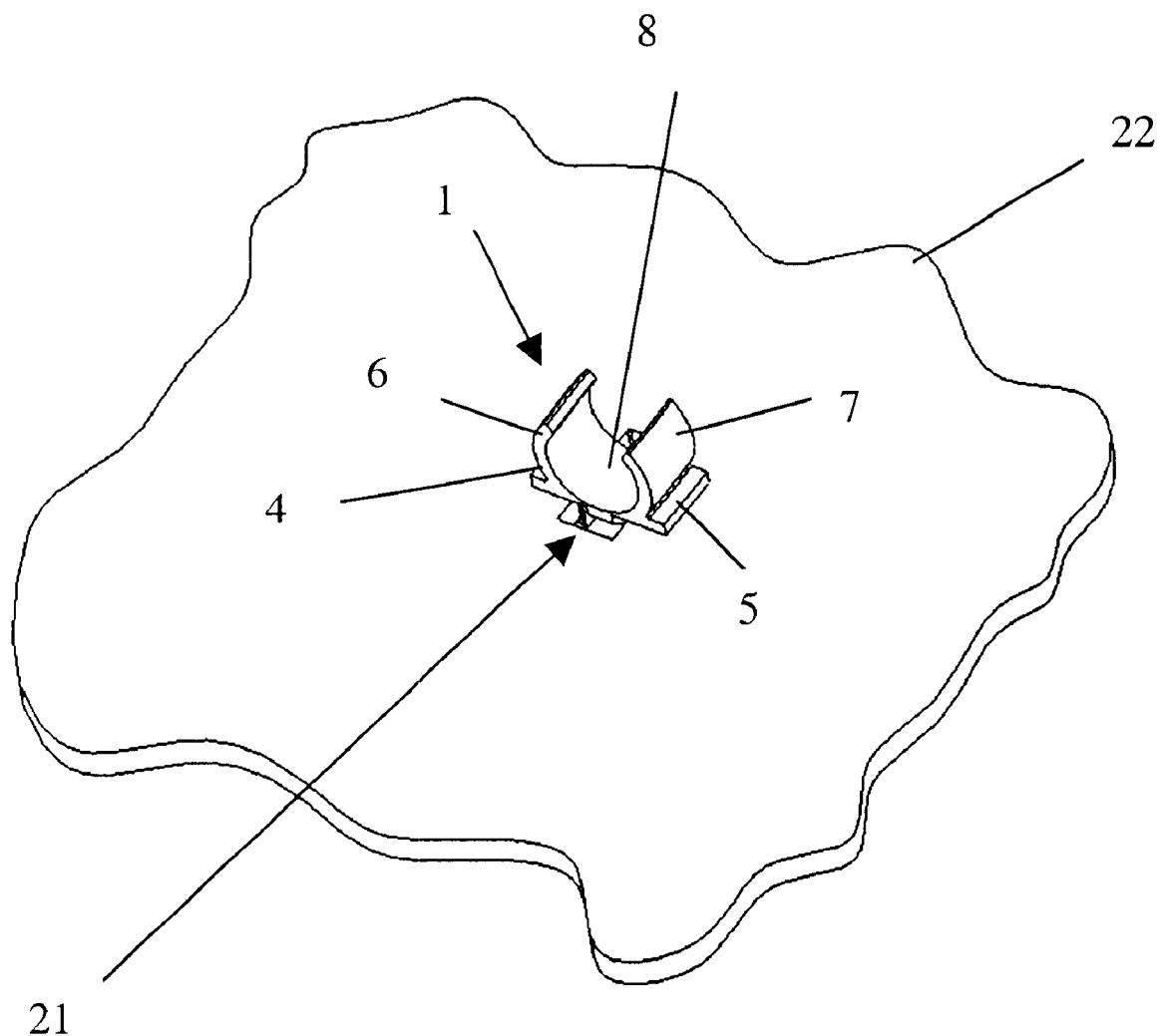
FIG. 3 is a isometric view of the component holder of FIG. 1 mounted on the printed circuit board of FIG. 2.

FIG. 3 illustrates the component holder 1 inserted into the slot 21 of the printed circuit board 22. The bottom of the slot 8 (FIG. 1) is substantially flush with the upper surface of the printed circuit board 22

Figure 4:
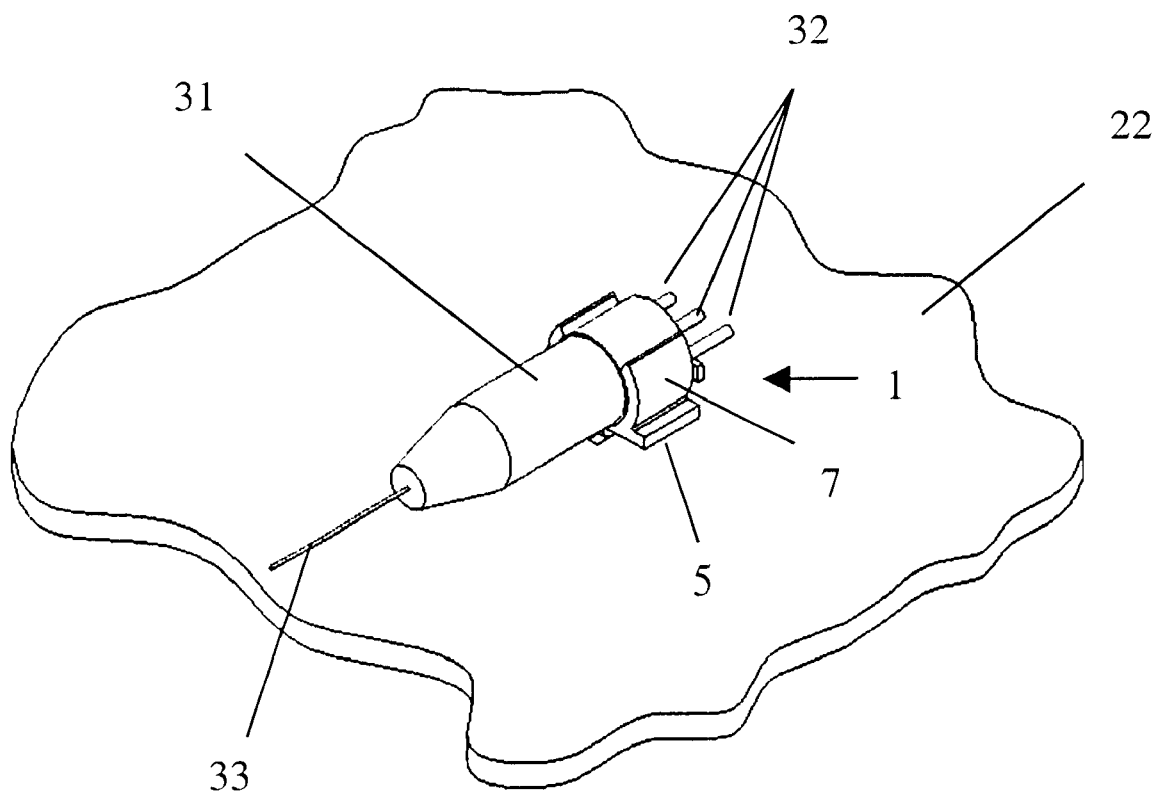
FIG. 4 is a isometric view of the component holder of FIG. 1 mounted on the printed circuit board of FIG. 2 holding a photodiode.

FIG. 4 illustrates the component holder 1 inserted into the slot 21 of the printed circuit board 22 with a photodiode 31 mounted therein flush to the surface of the circuit board 22. The photodiode 31 has electronic leads 32, which are normally soldered to pads on the printed circuit board 22. The component holder 1 and the solder combine to secure the photodiode 31 to the circuit board 22. Another benefit of the present invention is the ability to make minor adjustments to the alignment of the photodiode, prior to final connection of the electronic leads 32, by simply rotating the component bolder 1 clockwise or counter clockwise by a few degrees An optical fiber 33 is connected to the photodiode 31 for transmitting optical signals thereto.

I claim:

1. A component holder device for securing an electro-optical component substantially flush with an upper surface of a printed circuit board, the printed circuit board including a slot for receiving the component holder, the component holder comprising:

first and second base sections, each base section having a lower surface for substantially flush engaging the upper surface of the printed circuit board;

first and second resilient arms extending from the first and second base sections, respectively, for clamping the electro-optical component therebetween, the first and second resilient arms forming a cavity which extends substantially level with the lower surface of the first and second base sections, whereby the electro-optical component will be mounted substantially flush with the upper surface of the printed circuit board;

a body extending from the first and second base sections for extending through the slot;

first and second resilient feet extending outwardly from the body for engaging a lower surface of the printed circuit board after the body has been inserted through the slot and the component holder has been rotated.

2. The device according to claim 1, wherein at least one of the resilient arms includes a camming surface at an outer free ends thereof for facilitating insertion of the electro-optical component therebetween.

3. The device according to claim 1, wherein each foot includes a toe extending upwardly from an outer free end thereof for contacting the lower surface of the printed circuit board to ensure that the printed circuit board is firmly held between said bases and said feet.

4. The device according to claim 3, wherein each toe includes beveled front and rear surfaces for acting as a camming surface upon initial engagement with the lower surface of the circuit board.

5. The device according to claim 1, wherein the body includes two flexible legs extending perpendicularly to the first and second base sections for providing increased flexibility to the feet, which extend therefrom.

6. The device according to claim 1, wherein the first and second arms are C-shaped.

7. The device according to claim 1, wherein the first and second bases are superposed above the first and second feet, respectively.

8. The device according to claim 1, wherein the component holder device is of a unitary plastic construction.

9. The device according to claim 1, wherein the first and second feet are rectangular for insertion through rectangular portions of the slot, and wherein the body is round for insertion through a round portion of the slot.

10. A component holder device for securing an electro-optical component substantially flush with an upper surface of a printed circuit board, the printed circuit board including a slot for receiving the component holder, the component holder comprising:

a body for extending through the slot;

first and second resilient arms extending from the body for clamping the electro-optical component therebetween, the first and second resilient arms forming a cavity which extends substantially level with the upper surface of the printed circuit board, whereby the electro-optical component can be mounted substantially flush with the upper surface of the printed circuit board;

first and second bass sections extending from the first and second resilient arms respectively, each base section having a lower surface for substantially flush engaging the upper surface of the printed circuit board;

first and second resilient feet extending outwardly from the body for engaging a lower surface of the printed circuit board after the body has been inserted through the slot and the component holder has been rotated.

11. The device according to claim 10, wherein at least one of the resilient arms includes a camming surface at an outer free ends thereof for facilitating insertion of the electro-optical component therebetween.

12. The device according to claim 10, wherein each foot includes a toe extending upwardly from an outer free end thereof for contacting the lower surface of the printed circuit board to ensure that the printed circuit board is firmly held between said bases and said feet.

13. The device according to claim 12, wherein each toe includes beveled front and rear surfaces for acting as a camming surface upon initial engagement with the lower surface of the circuit board.

14. The device according to claim 10, wherein the body includes two flexible legs extending perpendicularly to the first and second base sections for providing increased flexibility to the feet, which extend therefrom.

15. The device according to claim 10, wherein the first and second arms are C-shaped.

16. The device according to claim 10, wherein the first and second bases are superposed above the first and second feet, respectively.

17. The device according to claim 10, wherein the component holder device is of a unitary plastic construction.

18. The device according to claim 10, wherein the first and second feet are rectangular for insertion through rectangular portions of the slot, and wherein the body is round for insertion through a round portion of the slot.

* * * * *